United States Patent [19]

Isozumi et al.

[11] Patent Number: 4,498,937
[45] Date of Patent: Feb. 12, 1985

[54] LIQUID PHASE EPITAXIAL GROWTH METHOD

[75] Inventors: Shoji Isozumi; Toshihiro Kusunoki, both of Kawasaki, Japan

[73] Assignee: Fujitsu Limited, Kawasaki, Japan

[21] Appl. No.: 489,348

[22] Filed: Apr. 28, 1983

[30] Foreign Application Priority Data

Apr. 28, 1982 [JP] Japan .............................. 57-072442

[51] Int. Cl.³ .......................................... H01L 21/208
[52] U.S. Cl. ..................................... 148/171; 148/172
[58] Field of Search ......................... 148/171, 172, 173

[56] References Cited

U.S. PATENT DOCUMENTS

| | | | |
|---|---|---|---|
| 3,631,836 | 1/1972 | Jarvela et al. | 148/171 |
| 3,753,801 | 8/1973 | Lockwood et al. | 148/171 |
| 3,793,093 | 2/1974 | Nishizawa et al. | 148/172 X |
| 4,088,514 | 5/1978 | Hara et al. | 148/171 |
| 4,110,133 | 8/1978 | Garrett et al. | 148/171 |
| 4,179,317 | 12/1979 | Sakai et al. | 148/171 |
| 4,246,050 | 1/1981 | Moon | 148/171 |
| 4,287,485 | 9/1981 | Hsieh | 148/171 X |
| 4,373,989 | 2/1983 | Beggs et al. | 148/172 X |

OTHER PUBLICATIONS

"Composition Profiles and Growth Kinetics of $Ga_x In_{1-x}P$ LPE Layers: Experiments and Theoretical Approach", Etcheberry et al., *Journal of Crystal Growth*, vol. 53, 1981, May, No. 2, pp. 413-417, Amsterdam, Netherlands.

*Primary Examiner*—G. Ozaki
*Attorney, Agent, or Firm*—Staas & Halsey

[57] ABSTRACT

During liquid phase epitaxial growth of a compound semiconductor layer on a substrate, an unsaturated solution is brought into contact with a solute source crystalline plate. The plate dissolves into the solution, which creates a supercooling condition in the solution without a decrease in the temperature of the solution. The crystalline plate has a denser crystal face than that of the substrate, and/or the lattice constant of the crystalline plate is considerably different from that of the substrate.

16 Claims, 15 Drawing Figures

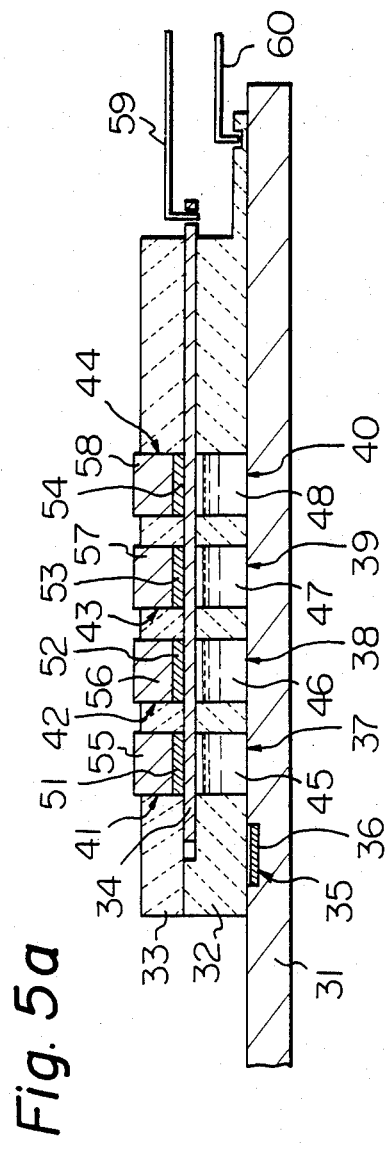
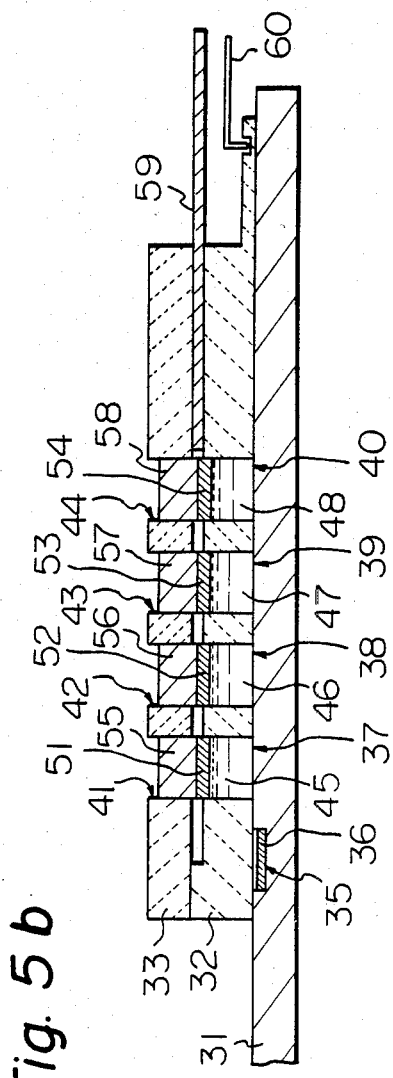

LIQUID PHASE EPITAXIAL GROWTH METHOD

BACKGROUND OF THE INVENTION

1. Field of the Invention

The present invention relates to liquid phase epitaxial (LPE) growth of compound semiconductors, more particularly, to an LPE growth method of a compound semiconductor layer in which a supercooling condition can be generated without controlled cooling.

2. Description of the Prior Art

Light emitting devices, for generating light medium information signals and light receiving devices for detecting the light, are used in various fields, such as optical communications, industrial equipment, and civilian life. Considerable research and development has been carried out on such devices.

Optical communications make use of AlGaAs/GaAs double hetero junction lasers, silicon PIN photo diodes, and silicon avalanche photo diodes, which are suitable for light having a wavelength of about 0.8 μm. The recent success in decreasing the transmission loss of optical fibers has also led to the development of semiconductor light emitting and light receiving devices suitable for light having a wavelength of from 1.0 to 1.7 μm.

Information terminal units or devices used in civilian life make use of semiconductor light emitting and light receiving devices for light having a shorter wavelength, by reasons of visibility, range of usable sensitized materials, flexibility of optical system design, safety codes, etc.

In order to produce semiconductor light emitting and light receiving devices having a desired wavelength character, an active layer of the devices is made of a semiconductor crystal with the band gap corresponding to the desired wavelength. The active layer and clad layers lying on both sides of the active layer are formed on a semiconductor single crystalline substrate by epitaxial growth. Between the active layer and the clad layer and between the clad layer and the substrate a hetero junction is formed. The hetero junction should have a smaller lattice distortion by matching the lattice constants of the active layer, the clad layers, and the substrate, to each other.

Epitaxial growth methods include LPE, vapor phase epitaxy (VPE), chemical vapor deposition (CVD), molecular beam epitaxy (MBE), and organic metal chemical vapor deposition (MO-CVD). The most suitable method is selected depending upon the conditions of the desired grown layer, such as the composition or thickness. The LPE method has been most extensively used because of its superiority. Since the properties and reliability of the semiconductor light emitting and light receiving devices depend on the crystal of the layer grown by the above-mentioned method, further improvements for elimination of crystal defects and stabilization of crystal composition are required.

The conventional LPE growth method of compound semiconductors includes a temperature drop method and temperature difference method.

In the temperature drop LPE method, the temperature of the semiconductor material solution is reduced over a certain period to generate a supercooling condition in the solution, whereby a crystal is epitaxially deposited on the semiconductor substrate to grow an epitaxial layer. However, the supercooling degree necessary for growing good crystal sometimes cannot be attained. Also, it is difficult to suppress composition variation of the growing layer and to increase the uniformity of the growing layer composition.

In the temperature difference LPE method, a temperature difference (i.e., a temperature gradient) is provided in a semiconductor material solution in the vertical direction to form a concentration gradient of the solute in the solution, whereby a crystal is epitaxially deposited on the semiconductor substrate to grow an epitaxial layer. However, it is not easy to carry out this method in practice, because the uniformity of the substrate surface temperature should be maintained and, at the same time, as large a temperature difference as possible should be provided in the vertical direction.

Below, a discussion of the growth of an indium-gallium-phosphide ($In_{1-x}Ga_xP$) layer on a gallium-arsenide (GaAs) substrate with a (100) face by the temperature drop LPE method, is presented.

Weighed semiconductor materials (In, InP, and GaP) with a desired weight ratio are put in a reservoir (i.e., a through hole) formed in a slider of a conventional slide type graphite boat. The materials are heated at an elevated temperature, e.g., 800° C., to melt them into a solution. In order to obtain a supercooling condition of the solution, the solution is cooled to a certain extent. A degree of supercooling of at least 5° C. is required for epitaxial growth at a temperature of about 800° C. To obtain an especially good epitaxial layer, a degree of supercooling of about 10° C. is required. Accordingly, after the solution is cooled to about 10° C., the slider brings the solution into contact with the GaAs substrate, whereby an InGaP crystal is precipitated on the substrate to form an InGaP layer. However, since the temperature of the solution is not uniformly decreased, namely, a temperature difference between the central part and the outer part of the solution occurs, the supercooling condition is easily broken during the cooling. Accordingly, it is very difficult to achieve a supercooling condition of at least 5° C. in practice. In this case, the desired $In_{1-x}Ga_xP$ layer cannot be grown with good reproducibility, since crystal defects, dislocations, voids, and the like are generated in the grown layer.

Furthermore, the lattice constant of the $In_{1-x}Ga_xP$ epitaxial crystal depends strongly on its composition. To form a high quality InGaP epitaxial layer, it is necessary to keep the variation of the solution composition as small as possible during the growth period. Thus, the conventional LPE method has limits as to the thickness and area of the grown layer.

SUMMARY OF THE INVENTION

An object of the present invention is to provide an LPE growth method without the above-mentioned problems.

Another object of the present invention is to provide an LPE growth method in which the supercooling condition of a semiconductor material solution is made without a temperature drop or temperature difference in the solution.

The above-mentioned and other objects of the present invention are attained by a first LPE growth method for growing a compound semiconductor layer on a semiconductor substrate comprising the steps of bringing a semiconductor material solution containing at least one of the elements forming the compound semiconductor layer into contact with a crystalline plate which contains at least one of the elements forming the compound semiconductor layer and has a denser crystal face, i.e., a crystal face having a higher Miller index, than that of the semiconductor substrate; and, then, bringing the semiconductor material solution into contact with the semiconductor substrate to form the compound semiconductor layer on the substrate.

A "denser crystal face" means that the number of atoms per unit area of one crystalline face is larger than that of another crystalline face, i.e., the number of atoms per area of the (111)B face is larger than that of the (100) face. For example, in the case of a zinc blend type structure of a GaAs single crystal, there are two atoms per unit square crystal lattice having the side length "A" (i.e., the lattice constant) and the area "A" in the (100) face, as illustrated in FIG. 1a, whereas there are two atoms per regular triangle having the side length $\sqrt{2}A$ and the area $\sqrt{3}A^2/2$ in the (111) B face, as illustrated in FIG. 1b. Accordingly, the number of atoms per unit area in the (111) B face is $2/\sqrt{3}$ times that in the (100) face, namely, the (111) B face is denser than the (100) face. Concerning other crystal faces and a synthetic face which is not defined by a specific orientation only, the number of atoms per unit area is defined in the same way.

The first LPE method of the present invention utilizes the phenomenon that the saturating concentration of a ternary or quaternary solution coming into contact with a higher density crystal face of a crystalline plate (i.e., a solute source), which includes at least one of elements forming a compound semiconductor layer, is higher than the saturating concentration of the solution coming into contact with a relatively low density crystal face of a substrate, with the result that the supercooling condition of the solution to the thin crystal face can be achieved without a temperature drop or temperature difference in the solution.

The above-mentioned and other objects of the present invention are also attained by a second LPE growth method for growing a compound semiconductor layer on a semiconductor substrate comprising the steps of: bringing a semiconductor material solution containing at least one of the elements forming the compound semiconductor layer into contact with a crystalline plate which contains at least one of the components forming the compound semiconductor layer and has a lattice constant different from that of the semiconductor substrate; and then, bringing the semiconductor material solution into contact with the semiconductor substrate to form the compound semiconductor layer on the substrate.

The above-mentioned second LPE method utilizes the phenomenon that in the case where the lattice constant of the epitaxial crystal precipitating on the substrate from the solution is different from (e.g., is larger than) the lattice constant of the crystalline plate (i.e., the solute source), the solute continues to dissolve into the solution after attaining a certain concentration corresponding to the saturating concentration attained by using a crystalline plate having a lattice constant equal to that of the epitaxial crystal, notwithstanding the fact that the dissolution rate of the crystalline plate slows down. The continuation of dissolution results in the supercooling condition of the solution. The lattice constant of the crystal precipitating from the solution is equal to or is very close to that of the substrate.

The above-mentioned difference of the lattice constant must be of an extent that it is impossible to grow the epitaxial crystal, e.g., at least 0.5%.

The difference of the lattice constant between the substrate and the crystalline plate is approximately 0.5%. In addition, the lattice constant of the crystalline plate is smaller than the lattice constant of the semiconductor substrate.

In accordance with the second LPE method of the present invention, it is possible to form an epitaxial layer on a substrate both when the crystalline plate has the same oriented crystal face as that of the substrate and when the crystalline plate has a denser crystal face than that of the substrate i.e., has a crystal face having a higher Miller index than that of the substrate. The latter case falls under the first LPE method of the present invention, so the two above-mentioned supercooling conditions can be simultaneously achieved.

In the first and second LPE methods of the present invention, after the semiconductor material solution is brought into contact with the crystalline plate of a solute source to attain a desired concentration of solute, one of the following procedures is effected:

(A) the solution is removed from the crystalline plate and then is brought into contact with the substrate; and (B) the solution is kept in contact with the crystalline plate and is brought into contact with the substrate.

The former case method may be regarded as corresponding to the temperature drop method of the prior art and is effective for multi-component system solutions in which the necessary supercooling degree is difficult to attain by conventional methods.

The latter case method may be regarded as corresponding to the temperature difference method of the prior art and creates the same condition in the solution as that of the former case immediately after the beginning of the epitaxial growth and then a steady state of solute diffuses into the solution. At a constant temperature, the crystalline plate of the solute source dissolves into the solution, the solute diffuses, and the compound semiconductor crystal is precipitated on the substrate. Thus, epitaxial growth of the compound semiconductor crystal stably proceeds, so that a large, uniform epitaxial layer can be obtained.

When the compound semiconductor layer is formed in accordance with the first or second LPE growth method of the present invention, it is not necessary to decrease the temperature of the solution or to provide a temperature gradient in the solution. However, in order to increase the growth rate, it is preferable to simultaneously provide a temperature drop or temperature gradient.

BRIEF DESCRIPTION OF THE DRAWINGS

FIGS. 5a, 5b, and 5c are sectional views of a growth apparatus in various stages of production of a laser device by an LPE method according to the present invention;

DESCRIPTION OF THE PREFERRED EMBODIMENTS

The present invention will now be explained in detail by the following examples for LPE growth of an $In_{1-x}Ga_xP$ layer on a GaAs substrate and an $In_{1-x}Ga_xAs$ layer on an InP substrate, with reference to the accompanying drawings.

EXAMPLE 1

Figure 1A:
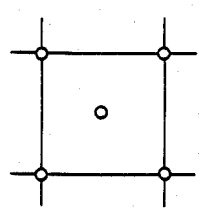
FIG. 1a is a schematic view of the (100) face of a zinc blend type structure of a single crystal.
Figure 1B:
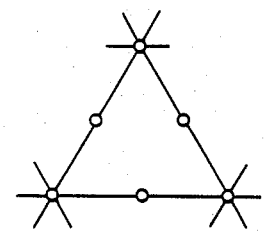
FIG. 1b is a schematic view of the (111) B face of a zinc blend type structure of a single crystal.
Figure 2A:
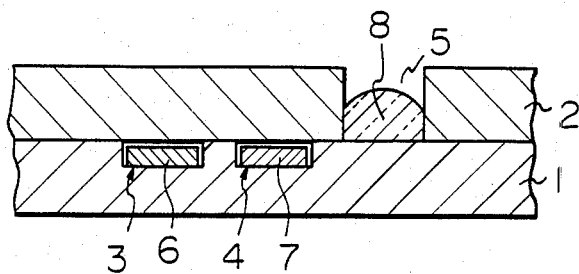
FIGS. 2a, 2b, and 2c are sectional views of a growth apparatus in various stages of an LPE growth in accordance with an embodiment of the present invention.

A slide type graphite boat comprising a stationary holder 1 and a slider 2, as shown in FIG. 2a, is used. In the holder 1, two recesses 3 and 4 for a substrate and a crystalline plate of solute source are formed. In the slider 2, a through hole (i.e., a reservoir) 5 is formed.

A GaAs (100) substrate 6 is put in the recess 3, and a GaP (111) B plate 7 serving as the solute source plate is put in the recess 4. It is possible to use the (111)A plate for the solute source plate.

In and InP semiconductor materials (ratio In:InP = 1 g:24 mg) are placed in the through hole 5 and then are heated at a temperature of 780° C. for about 30 minutes under a hydrogen atmosphere to melt them, with the result that an In-P solution 8, still unsaturated with P, is obtained.

Figure 2B:
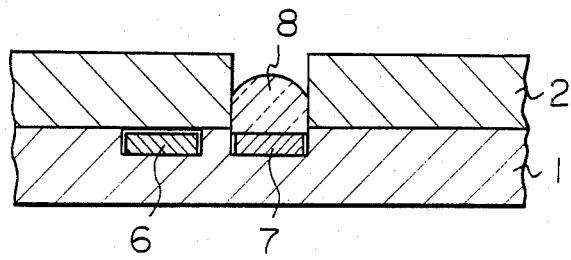

Next, the slider 2 is slid, so as to bring the binary solution 8 into contact with the (111) B face of the GaP plate 7, as shown in FIG. 2b. This condition is maintained for 30 minutes (at 780° C.). Thus, the GaP plate 7 dissolves into the binary solution 8 to change it to an In-Ga-P ternary solution 8. The obtained composition of the ternary solution 8 is $X_{Ga}^l = 0.092$, $X_P^l = 0.027$ and the rest In, wherein $X_i^l$ represents the atomic fraction of an element "i" in the solution "l".

Figure 2C:
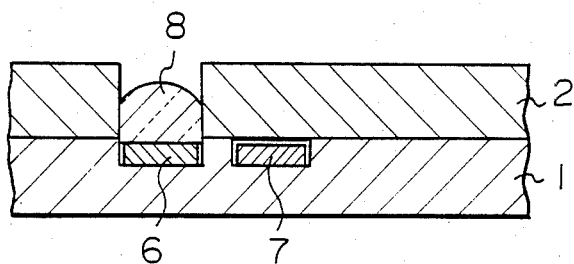

Then, the slider 2 is further slid, so as to bring the ternary solution 8 into contact with the GaAs substrate 6, as shown in FIG. 2c. This condition is maintained for 30 minutes, with the result that an $In_{1-x}Ga_xP$ crystal is precipitated on the substrate 6 to form the $In_{1-x}Ga_xP$ epitaxial layer having a thickness of 2.5 μm, "x" in the chemical formula being 0.50.

In this example, the solute concentration of the solution 8 coming in contact with the (111) B face of the GaP (solute source) plate 7, is higher than the saturating concentration of the solution 8 coming in contact with the (100) face of the substrate, so that the supercooling condition of th solution is achieved, in accordance with the first LPE growth method of the present invention. Furthermore, the lattice constants of $In_{0.5}Ga_{0.5}P$ and GaP at 800° C. are 567 pm (picometer) and 546 pm, respectively. The difference between the lattice constants is relatively large, about 3.6%. In accordance with the second LPE growth method of the present invention, the GaP plate 7 continues to dissolve into the solution 8. However, since the solution 8 comes into contact with the GaP plate 7 for 30 minutes, the dissolved amount of the GaP plate is not sufficient to cause the supercooling condition.

EXAMPLE 2

An InGaP layer is epitaxially formed under the same conditions as those of Example 1 except that the contacting time of the solution 8 to the GaP plate 7 is 60 minutes. The obtained $In_{1-x}GaP$ epitaxial layer has a thickness of 4 μm, "x" being 0.52. In this example, the supercooling effect due to the second LPE growth method in addition to the supercooling effect in Example 1 due to the first LPE growth method occurs.

EXAMPLE 3

Figure 3A:
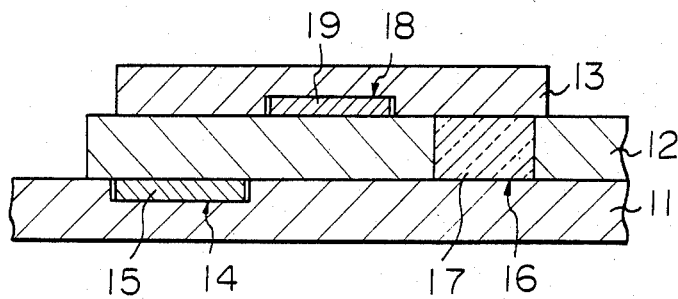
FIGS. 3a, 3b, and 3c are sectional views of another growth apparatus in various stages of an LPE growth method in accordance with another embodiment of the present invention.

A slide type graphite boat comprising a stationary holder 11, a first slider 12, and a second slider 13, as shown in FIG. 3a, is used. In a recess 14 of the holder 1, a GaAs (100) substrate 15 is placed. In a through hole 16, semiconductor materials for a solution 17 are placed. In a recess 18, a GaP (111) B plate 19 serving as a solute source is placed.

Semiconductor materials (In and InP) having a ratio of In:InP = 1 g:24 mg are heated at 780° C. for 30 minutes under a hydrogen atmosphere to melt them, with the result that an In-P binary solution 17, still unsaturated with P, is obtained.

Figure 3B:
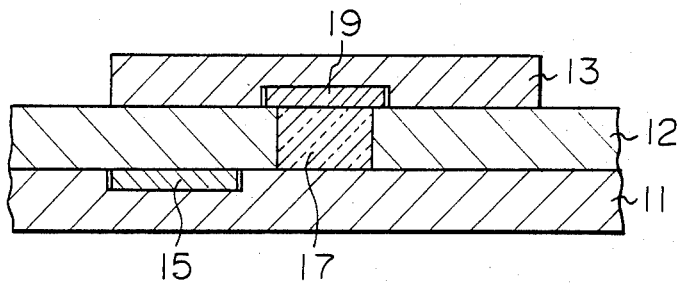

Then, the first slider 12 is slid, so as to bring the binary solution 17 into contact with the GaP plate 19, as shown in FIG. 3b. This condition is maintained for 60 minutes at 780° C. Thus, the GaP plate 19 dissolves into the binary solution 17 to change it to an In-Ga-P ternary solution 17.

Figure 3C:
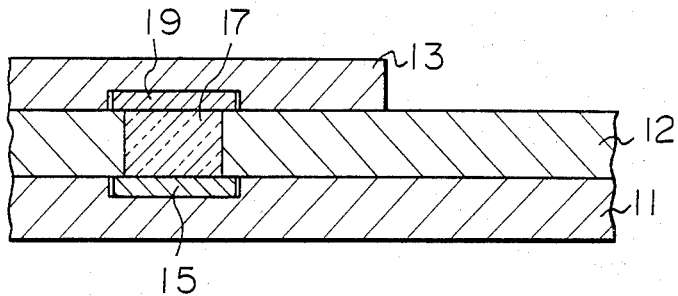

Next, the first and second sliders 12 and 13 are simultaneously slid, so as to bring the ternary solution 17 into contact with the GaAs substrate 15, as shown in FIG. 3c. This condition is maintained for 30 minutes to form an $In_{1-x}Ga_xP$ epitaxial layer on the GaAs substrate. The obtained layer has a thickness of 6 μm, "x" being 0.52.

In this case, a thicker epitaxial layer than that in Example 2 can be formed, because the ternary solution 17 continues to contact the GaP plate 19 during the epitaxial growth period. When the solution 17 comes in contact with both the GaP plate 19 and the GaAs substrate, transport of the solute by diffusion is carried out by dissolving the GaP solute source plate into the solution 17, diffusing the solute due to a concentration gradient in the solution 17, and precipitating InGaP crystal on the GaAs substrate 15. The concentration gradient of the solute in the solution 17 occurs since the solute concentration at the solid-liquid interface of the GaP plate 19 is higher than that at the solid-liquid interface of the GaAs substrate 15.

EXAMPLE 4

An InGaP layer is epitaxially formed under the same conditions as those of Example 2 except that a GaAs (111) B substrate is used instead of the GaAs (100) substrate. The obtained $In_{1-x}Ga_xP$ epitaxial layer has a thickness of 4 μm, "x" being 0.48.

EXAMPLE 5

An InGaP layer is epitaxially formed under the same conditions as those of Example 3 except that a GaAs (111) B substrate is used. The obtained $In_{1-x}Ga_xP$ epitaxial layer has a thickness of 2 μm, "x" being 0.48.

Examples 4 and 5 are carried out in accordance with the second LPE growth method of the present invention. The continuous dissolution of the GaP solute source plate into the solution, which creates a supercooling condition, is now explained with reference to FIG. 4.

Figure 4:
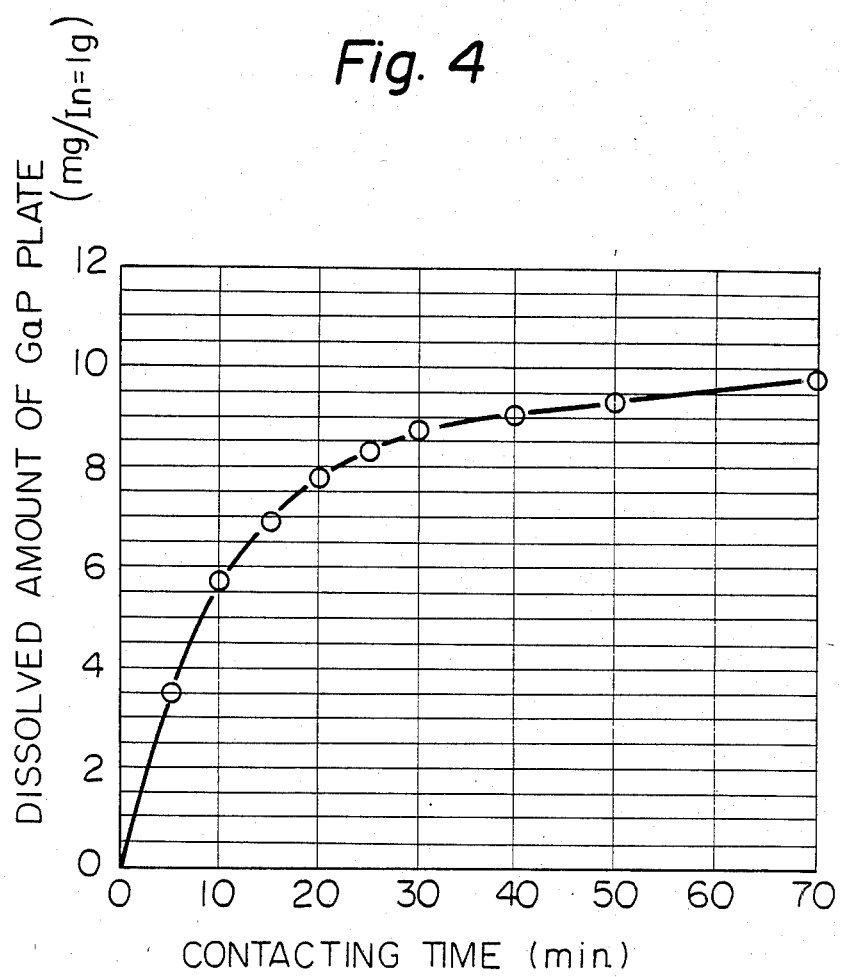
FIG. 4 is a graph of the relationship between the contacting time of a solution to a crystalline plate of solute source and the dissolved amount of the crystalline plate.

An In-P binary solution is formed by heating semiconductor materials of In and InP (ratio In:InP=1 g:24 mg) at 780° C. for 30 minutes under a hydrogen atmosphere in the same manner as Example 1. The In-P solution is brought into contact with the (111) B face of the GaP plate and the dissolved amount of the GaP plate is measured. The obtained results are shown in FIG. 4, with the contacting time as the abscissa and the dissolved amount as the ordinate. As is clear from FIG. 4, the dissolving rate is decreased, but the dissolution of the GaP plate continues.

When the lattice constant of a precipitating crystal is very close to that of a solute source plate, for example, when a Ga-Al-As unsaturated solution is brought into contact with the (111) B face of a GaAs plate, the saturation point at which the dissolution of the GaAs plate stops clearly appears. In this case, a GaAlAs crystal is easily precipitated on the surface of the GaAs plate from the solution at the saturation point to form a thin GaAlAs film, so that metastable chemical equilibrium between the thin GaAlAs film and the solution is established.

However, in the case of FIG. 4, according to the present invention, after the In-P solution comes in contact with the GaP plate for 70 minutes, the (111) B face of the GaP plate is examined by means of Auger electron spectrometry and photo-luminescence spectrometry. The examination showed that the surface of the GaP plate appears without precipitation of InGaP crystal on the surface. Namely, when the lattice constant of the crystal precipitating from the solution is considerably different from the lattice constant of the solute source plate coming in contact with the solution, no thin InGaP film is formed which can metastably chemically equilibrate with the solution. Accordingly, the dissolution of the solute source plate into the solution continues, after reaching a certain concentration corresponding to the saturating concentration attained by using another solute source plate with a lattice constant very close to the precipitating crystal. Thus, the solute concentration is increased and the supercooling condition of the solution is achieved. Then, when the obtained solution is brought into contact with a substrate with a lattice constant very close to the precipitating crystal, the epitaxial crystal growth proceeds, notwithstanding the fact that the substrate has the same oriented face as that of the solute source plate. A 0.5% and more difference of the lattice constant between the substrate and the solute source plate may ensure the above-mentioned continuation of dissolution.

COMPARATIVE EXAMPLE 1

The GaAs (100) substrate 6 in Example 1 is replaced with a GaAs (111) B substrate. Epitaxial growth of an InGaP layer on the GaAs (111) B substrate 6 is attempted under the same conditions as Example 1. It is found that no InGaP layer is formed and the substrate 6 dissolves into the solution. In this case, the solution 8, coming in contact with the GaP plate 7 for 30 minutes does not attain the supercooling condition with respect to the (111) B face of the GaAs substrate. However, it is clear from Example 1 that the solution 8 is in the supercooling condition with respect to the (100) face of the GaAs substrate.

COMPARATIVE EXAMPLE 2

In order to compare the supercooling condition obtained in accordance with the first LPE growth method of the present invention and the conventional temperature drop LPE growth method GaP powders corresponding to the dissolved amount of the GaP plate 7 in Example 1 are placed in a reservoir together with the weighed In and InP materials. The GaP, In, and InP materials are heated at 790° C. for about an hour under a hydrogen atmosphere to melt them into a solution. After the solution is cooled to 780° C., the solution is brought into contact with the (100) face and the (111) B face of the GaAs substrate, respectively. In this case, it is found that the epitaxial layer is formed neither on the (100) face nor on the (111) B face and, the GaAs (100) substrate dissolves.

EXAMPLE 6

Using the slide type graphite boat of Example 1, an InP (100) substrate 6 is placed in the recess 3 and a GaAs (111) B substrate 7 is placed in the recess 4, as shown in FIG. 2a. Semiconductor materials In and InAs (having a ratio of In:InAs=1 g:72.6 mg) are placed in the through hole 5 and are then heated at a temperature of 650° C. for about 30 minutes under a hydrogen atmosphere to obtain an In-As binary solution 8 unsaturated with As.

Then, the binary solution 8 is brought into contact with the (111) B face of the GaAs plate 7 and is maintained at 650° C. for 30 minutes, as shown in FIG. 2b. Thus, the GaAs plate 7 dissolves into the binary solution 8 to change it into an In-Ga-As ternary solution 8. The composition of the ternary solution 8 is $X_{Ga}^l=0.024$, $X_{As}^l=0.062$, and the rest is In.

Next, the ternary solution 8 is brought into contact with the (100) face of the InP substrate 6, as shown in FIG. 2c. This condition is maintained for 10 minutes, with the result that an $In_{1-x}Ga_xAs$ epitaxial layer (having a thickness of 5 μm, "x" being 0.47) is formed on the InP substrate 6.

EXAMPLE 7

An InGaAs layer is epitaxially formed under the same conditions as those of Example 6 except that the contacting time of the solution 8 with the InP substrate 7 is 60 minutes. The obtained $In_{1-x}Ga_xAs$ layer has a thickness of 8 μm, "x" being 0.52.

In Examples 6 and 7, the lattice constants of the InP substrate 6 and the GaAs plate 7 are 586.9 pm and 565.3 pm, respectively. The difference of the lattice constant between them is about 3.7%.

EXAMPLE 8

The LPE growth method of the present invention is applied to the formation of compound semiconductor layers on a GaAs substrate so as to produce a semiconductor laser having an InGaP/InGaAsP double-heterojunction structure.

A slide type graphite boat comprising a stationary holder 31, a first slide part 32, a second slide part 33, and a separator 34 between the slide parts 33 and 34, as shown in FIG. 5a, is used. A recess 35 is formed in the holder 31 and the GaAs (100) substrate 36 is placed in the recess 35. Through holes 37, 38, 39 and 40 are formed in the first slide part 32, and through holes 41, 42, 43, and 44 are formed in the second slide part 33. The through holes 41 to 44 are arranged above the through holes 37 to 40, respectively. The first and second slide parts 32 and 34 are fixed to each other to form one body. When the separator 34 is inserted between the first and second slide parts 32 and 33, all the through holes 37 to 44 are independent from each other. Predetermined semiconductor materials 45, 46, 47, and 48 for solutions are placed in the through holes 37 to 40. After the separator 34 is inserted, GaP single crystalline plates (i.e., solute source plates) 51, 52, 53, and 54 are placed in the through holes 41 to 44, and then weights 55, 56, 57, and 58 are placed on the plates 51 to 54, respectively. The bottom surface of the plates 51 to 54 is the (111) B face of the GaP crystal. Then, the boat is heated at 780° C. for about 30 minutes under a hydrogen atmosphere to melt the semiconductor material, with the result that solutions 45, 46, 47, and 48 have compositions as shown in Table 1.

TABLE 1

| | (Atomic percent) | | | |
|---|---|---|---|---|
| | Ga conc. $X_{Ga}^l$ | P conc. $X_p^l$ | As conc. $X_{As}^l$ | Impurity conc. $X_l^l$ |
| First solution (45) | 0 | 0.018 | 0 | 0.0007 (Se) |
| Second solution (46) | 0.009 | 0 | 0.098 | 0.0007 (Zn) |
| Third solution (47) | 0 | 0.019 | 0 | 0.00007 (Zn) |
| Fourth solution (48) | 0.050 | 0 | 0.109 | 0.00014 (Se) |

Note:
The rest of the solution is In.
Conc. is the abbreviation for concentration.

Next, the separator 34 is slid by a rod 59 (FIG. 5a) to bring the (111) B face of the GaP plates 51 to 54 into contact with the solutions 45 to 48, respectively, as shown in FIG. 5b. The GaP plates 51 to 54 dissolve into the solutions 45 to 48 at a temperature of 780° C. for 40 minutes.

Figure 5C:
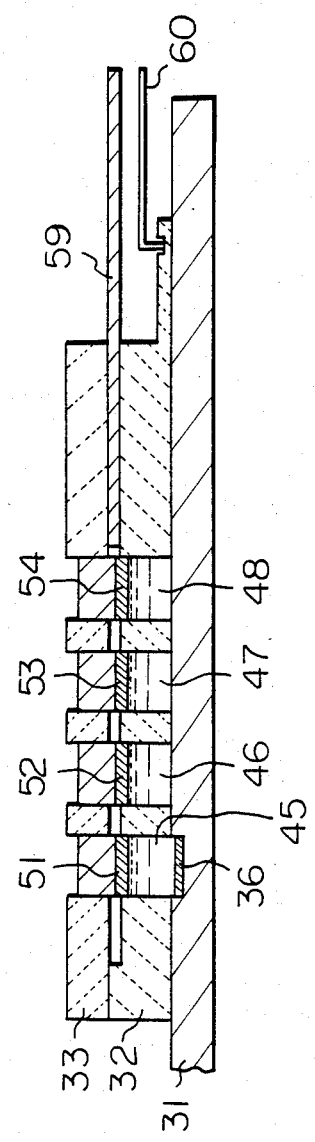
Figure 6A:
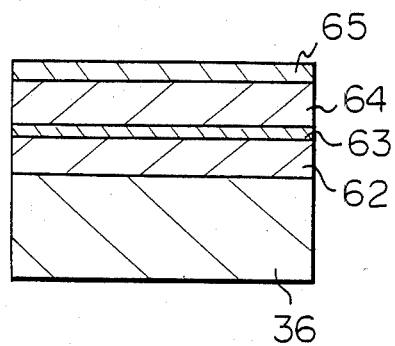
FIG. 6a is a schematic sectional view of the laser device produced in the apparatus of FIGS. 5a to 5c.

Then the first and second slide parts 32 and 33 are slid by a rod 60, as shown in FIG. 5c, so as to bring the solution 45 into contact with the GaAs substrate 35, whereby a first compound semiconductor layer 62 (FIG. 6a) is epitaxially formed on the substrate 36. In this manner, the slide parts 32 and 33 are further slid to sequentially bring the solutions 46, 47, and 48 into contact with the GaAs substrate 36, so that second, third, and fourth compound semiconductor layers 63, 64, and 65 are epitaxially formed on the substrate 36, respectively. Contacting times (i.e., growing times) of the solutions, compositions, thicknesses, and carrier concentrations of the obtained layers 62 to 65 are shown in Table 2.

TABLE 2

| | Growing time | Composition | Thickness (μm) | Carrier conc. (cm$^{-3}$) |
|---|---|---|---|---|
| First layer (62) | 10 min | $In_{0.49}Ga_{0.51}P$ | 1.5 | $1 \times 10^{18}$ (n) |
| Second layer (63) | 3 sec | $In_{0.30}Ga_{0.70}As_{0.34}P_{0.66}$ | 0.07 | $5 \times 10^{18}$ (p) |
| Third layer (64) | 10 min | $In_{0.49}Ga_{0.51}P$ | 2.0 | $5 \times 10^{18}$ (p) |
| Fourth layer (65) | 1 min | $In_{0.20}Ga_{0.80}As_{0.60}P_{0.40}$ | 0.8 | $2 \times 10^{18}$ (n) |

In this case, the GaP plates 51 to 54 are simultaneously brought into contact with the solutions 45 to 48, so that the duration of contact may be too long for the fourth solution 40. Depending on the circumstances, the duration of contact for each of the solutions 45 to 48 can be controlled by adjusting the movement of the separator 34.

Figure 6B:
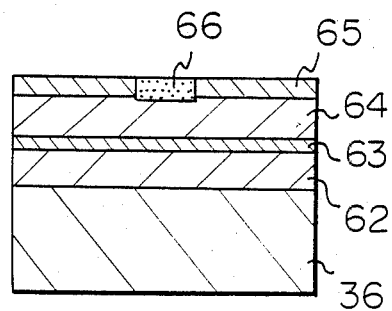
FIG. 6b is a schematic sectional view of the laser device of FIG. 6a provided with a stripe doped region.

Each of the four epitaxal layers 62 to 65 formed on the GaAs substrates 36 (FIG. 6a) is lattice-matched to the substrate 36 with a lattice constant difference of less than 0.1%. Thus, the crystals of the epitaxial layers are excellent. In the semiconductor laser case, the p-type second InGaAsP layer 63 serves as an active layer, and the n-type first InGaP layer 62 and the p-type third InGaP layer 64 are clad layers. The n-type fourth InGaAsP layer 65 is formed for providing a stripe conducting region 66 (FIG. 6b). The stripe region 66 is formed by selectively doping impurities of Zn into the fourth layer 65.

Figure 6C:
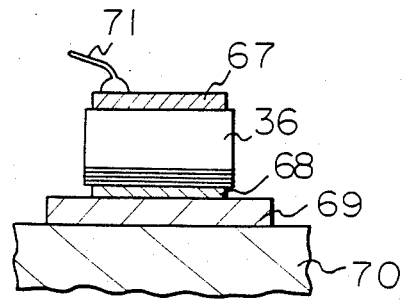
FIG. 6c is a schematic sectional view of the laser device of FIG. 6b in an assembled condition.

Then, an AuSn alloy layer 67 (FIG. 6c) is formed on the GaAs substrate 36, and an AuZn alloy layer 68 is formed on the fourth epitaxal layer 65 by a vacuum evaporation method. These alloy layers 67 and 68 are heat treated to make them ohmic electrodes. The obtained substrate 36 is cleaved into semiconductor laser chips. The chip is attached to a heat sink 69 in the p-side down manner, as shown in FIG. 6c, the heat sink 69 being fixed on a stem 70. A wire 71 is bonded to the AuSn alloy layer (i.e., the n-electrode) 67. Thus, a semiconductor laser device is produced.

When the obtained laser device operates at about 25° C. (room temperature), a continuous wave (CW) oscillation can be confirmed. The oscillating wavelength is 730 nm and the oscillating threshold current is 120 mA.

It will be obvious that the present invention is not restricted to the above-mentioned examples, and that many variations are possible by persons with ordinary skill in the art. For example, various compound semiconductor layers of III-V and II-VI groups can be epitaxially formed in accordance with the LPE method of the present invention. The substrate and the crystalline plate (i.e., solute source plate) may be ternary, quaternary, or the like. The solution and the precipitating crystal may be a quaternary or more multicomponent system. Before the unsaturated solution is brought into contact with the solute source plate, the solution may contain all components of the epitaxial layer. Furthermore, it is possible to suitably choose an oriented crystal plane for the substrate and the solute source plate.

We claim:

1. A liquid phase epitaxial growth method for growing a compound semiconductor layer on a semiconductor substrate comprising the steps of:

(a) bringing a semiconductor material solution, containing at least one of the components forming the compound semiconductor layer, into contact with a crystalline plate which has a composition different from that of the semiconductor substrate and contains at least one of the components forming the compound semiconductor layer, the semiconductor component in the crystalline plate is dissolved into the semiconductor material solution and a supercooling condition occurs in the semiconductor material solution, the crystalline plate having a crystal face having a higher Miller index than that of the semiconductor substrate; and (b) bringing the semiconductor material solution into contact with the semiconductor substrate to form the compound semiconductor layer on the semiconductor substrate.

2. A liquid phase epitaxial growth method according to claim 1, wherein prior to said step (b) of bringing the semiconductor material solution into contact with the semiconductor substrate, the semiconductor material solution is detached from the crystalline plate.

3. A liquid phase epitaxial growth method according to claim 2, wherein the semiconductor substrate has a (100) face and the crystalline plate has a (111) face.

4. A liquid phase epitaxial growth method according to claim 1, wherein during said step (b) of bringing the semiconductor material solution into contact with the semiconductor substrate, the solution continues to contact the crystalline plate.

5. A liquid phase epitaxial growth method according to claim 4, wherein the semiconductor substrate has a (100) face and the crystalline plate has a (111) face.

6. A liquid phase epitaxial growth method for growing a compound semiconductor layer on a semiconductor substrate comprising the steps of:
  (a) bringing a semiconductor material solution, containing at least one of the components forming the compound semiconductor layer, into contact with a crystalline plate which has a composition different from that of the semiconductor substrate and contains at least one of the components forming the compound semiconductor layer, the semiconductor component in the crystalline plate is dissolved into the semiconductor material solution and a supercooling condition occurs in the semiconductor material solution, the crystalline plate having a lattice constant different from that of the semiconductor substrate; and
  (b) bringing the semiconductor material solution into contact with the semiconductor substrate to form the compound semiconductor layer on the semiconductor substrate.

7. A liquid phase epitaxial growth method according to claim 6, wherein prior to said step (b) of bringing the semiconductor material solution into contact with the semiconductor substrate, the solution is detached from the crystalline plate.

8. A liquid phase epitaxial growth method according to claim 7, wherein the difference between the lattice constant of the crystalline plate and the semiconductor substrate is at least 0.5%.

9. A liquid phase epitaxial growth method according to claim 8, wherein the lattice constant of the crystalline plate is smaller than that of the semiconductor substrate.

10. A liquid phase epitaxial growth method according to claim 7, wherein the semiconductor substrate has a crystal face and wherein the crystal face of the crystalline plate has the same Miller index as that of the semiconductor substrate.

11. A liquid phase epitaxial growth method according to claim 7, wherein the semiconductor substrate has a crystal face and wherein the crystalline plate has a crystal face having a higher Miller index than that of the semiconductor substrate.

12. A liquid phase epitaxial growth method according to claim 6, wherein during said step (b) of bringing the semiconductor material solution into contact with the semiconductor substrate, the solution continues to contact the crystalline plate.

13. A liquid phase epitaxial growth method according to claim 12, wherein the difference between the lattice constant of the crystalline plate and the semiconductor substrate is at least 0.5%.

14. A liquid phase epitaxial growth method according to claim 13, wherein the lattice constant of the crystalline plate is smaller than that of the semiconductor substrate.

15. A liquid phase epitaxial growth method according to claim 12, wherein the semiconductor substrate has a crystal face and wherein the crystal face of the crystalline plate has the same Miller index as that of the semiconductor substrate.

16. A liquid phase epitaxial growth method according to claim 12, wherein the semiconductor substrate has a crystal face and wherein the crystalline plate has a crystal face having a higher Miller index than that of the semiconductor substrate.

* * * * *

UNITED STATES PATENT AND TRADEMARK OFFICE
CERTIFICATE OF CORRECTION

PATENT NO. : 4,498,937
DATED : February 12, 1985
INVENTOR(S) : Shoji Isozumi et al.

It is certified that error appears in the above-identified patent and that said Letters Patent is hereby corrected as shown below:

Column 3, line 11, "blend" should read -- blende --.
          line 29, "of" should read -- of the --.
Column 4, line 54, "blend" should read -- blende --.
          line 55, "blend" should read -- blende --.
Column 5, line 57, "th" should read -- the --.
Column 9, In Table 1, line 3, last item, "$X_i 1$" should read -- $X_i \ell$ --.

Signed and Sealed this

Tenth Day of December 1985

[SEAL]

Attest:

DONALD J. QUIGG

Attesting Officer     Commissioner of Patents and Trademarks